(12) United States Patent
Balm

(10) Patent No.: US 8,965,315 B2
(45) Date of Patent: Feb. 24, 2015

(54) IMPEDANCE CIRCUIT AND METHOD FOR SIGNAL TRANSFORMATION

(75) Inventor: Bart Balm, Kekerdom (NL)

(73) Assignee: EPCOS AG, Munich (DE)

( * ) Notice: Subject to any disclaimer, the term of this patent is extended or adjusted under 35 U.S.C. 154(b) by 361 days.

(21) Appl. No.: 13/451,991

(22) Filed: Apr. 20, 2012

(65) Prior Publication Data

US 2012/0286586 A1 Nov. 15, 2012

Related U.S. Application Data

(63) Continuation of application No. PCT/EP2009/064855, filed on Nov. 9, 2009.

(51) Int. Cl.
| | | |
|---|---|---|
| H04B 1/16 | (2006.01) | |
| H03H 7/38 | (2006.01) | |
| H03F 1/56 | (2006.01) | |
| H03F 3/24 | (2006.01) | |
| H03H 7/01 | (2006.01) | |

(52) U.S. Cl.
CPC . *H03H 7/38* (2013.01); *H03F 1/56* (2013.01); *H03F 3/24* (2013.01); *H03H 7/0153* (2013.01); *H03F 2200/387* (2013.01)
USPC .......................... 455/195.1; 341/122; 307/109

(58) Field of Classification Search
CPC .......... H03M 1/00; H03M 2201/4135; H03M 2201/4225; H03M 2201/4233; H03M 2201/4262; H03M 1/168; H03M 1/804; H03M 1/109; H03M 1/167; H03M 1/44; H03M 2201/16; H03M 2201/225; H03M 2201/3115; H03M 1/123; H03M 1/145; H03M 1/403; H03M 2201/01; H03M 2201/1172; H03M 2201/13; H03M 2201/2208; H03M 2201/2216; H03M 2201/2311; H03M 2201/235; H03M 2201/3105; H03M 2201/311; H03M 2201/3178; H03M 2201/816; H03M 2201/847
See application file for complete search history.

(56) References Cited

U.S. PATENT DOCUMENTS

| | | | | |
|---|---|---|---|---|
| 4,031,491 | A | * | 6/1977 | Sakamoto ................... 455/195.1 |
| 5,481,450 | A | * | 1/1996 | Lee et al. .................... 363/21.16 |
| 6,088,214 | A | | 7/2000 | Malone et al. |
| 6,459,458 | B1 | * | 10/2002 | Balaban ..................... 455/232.1 |
| 6,909,589 | B2 | | 6/2005 | Huff |

(Continued)

FOREIGN PATENT DOCUMENTS

| | | |
|---|---|---|
| EP | 1 386 400 B1 | 4/2007 |
| JP | 04-186184 A | 7/1992 |

(Continued)

OTHER PUBLICATIONS

Infineon Technologies, "Transceiver for Bluetooth FH-SS 2.4 GHz Systems" Infineon Technologies Datasheet, PMB 6625/27, BiCMOS IC, Downloaded Nov. 4, 2009, 2 pages.

*Primary Examiner* — Lana N Le
(74) *Attorney, Agent, or Firm* — Slater & Matsil, L.L.P.

(57) ABSTRACT

An impedance circuit includes an input terminal, a first and a second capacitive arrangement and an output terminal coupled to the input terminal by a network. The network includes the first and the second capacitive arrangement. The first capacitive arrangement includes a varactor circuit having a varactor and at least one series circuit. The at least one series circuit includes a capacitor and a switch in series connection and is coupled parallel to the varactor circuit. The second capacitive arrangement comprises an additional capacitor.

2 Claims, 8 Drawing Sheets

(56) References Cited

U.S. PATENT DOCUMENTS

| | | |
|---|---|---|
| 6,924,706 B2 | 8/2005 | Balm et al. |
| 7,212,076 B1 | 5/2007 | Taheri et al. |
| 8,803,631 B2 * | 8/2014 | Manssen et al. ............... 333/32 |
| 2002/0163406 A1 * | 11/2002 | Kawai ........................ 333/214 |
| 2004/0041671 A1 | 3/2004 | Van Rumpt |
| 2004/0147237 A1 | 7/2004 | Eckl et al. |
| 2005/0184828 A1 | 8/2005 | Son et al. |
| 2007/0247237 A1 | 10/2007 | Mohammadi |
| 2008/0122553 A1 | 5/2008 | McKinzie |
| 2008/0290947 A1 | 11/2008 | Dawe |
| 2009/0040088 A1 * | 2/2009 | Ozeki et al. .................. 341/161 |
| 2009/0134960 A1 | 5/2009 | Larson et al. |
| 2009/0135041 A1 * | 5/2009 | Han et al. ..................... 341/172 |
| 2010/0117450 A1 * | 5/2010 | Azrai et al. ..................... 307/31 |

FOREIGN PATENT DOCUMENTS

| | | |
|---|---|---|
| JP | 2004-505485 A | 2/2004 |
| WO | 2006092855 A1 | 9/2006 |
| WO | 2008031717 A2 | 3/2008 |

* cited by examiner

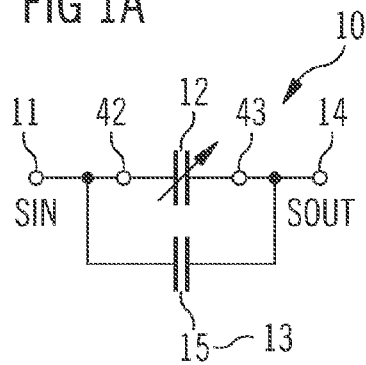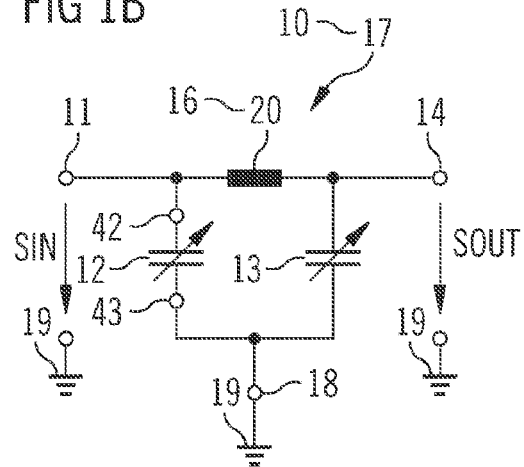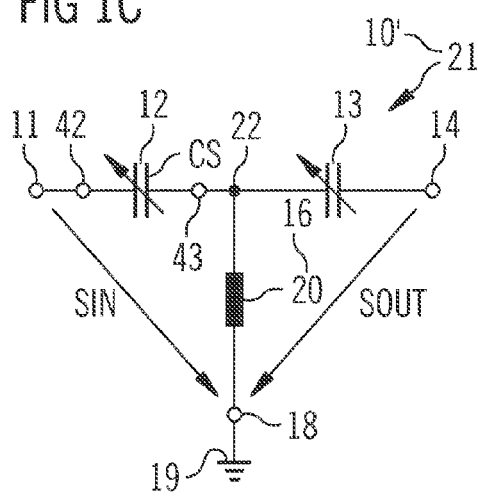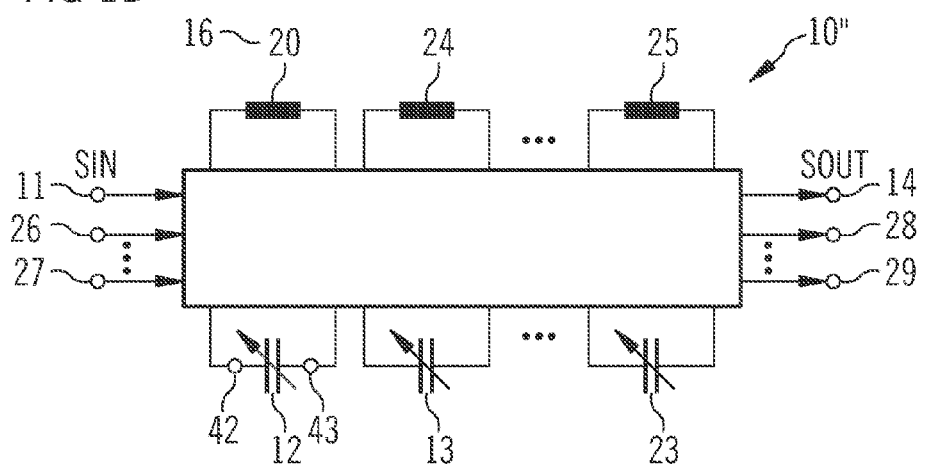

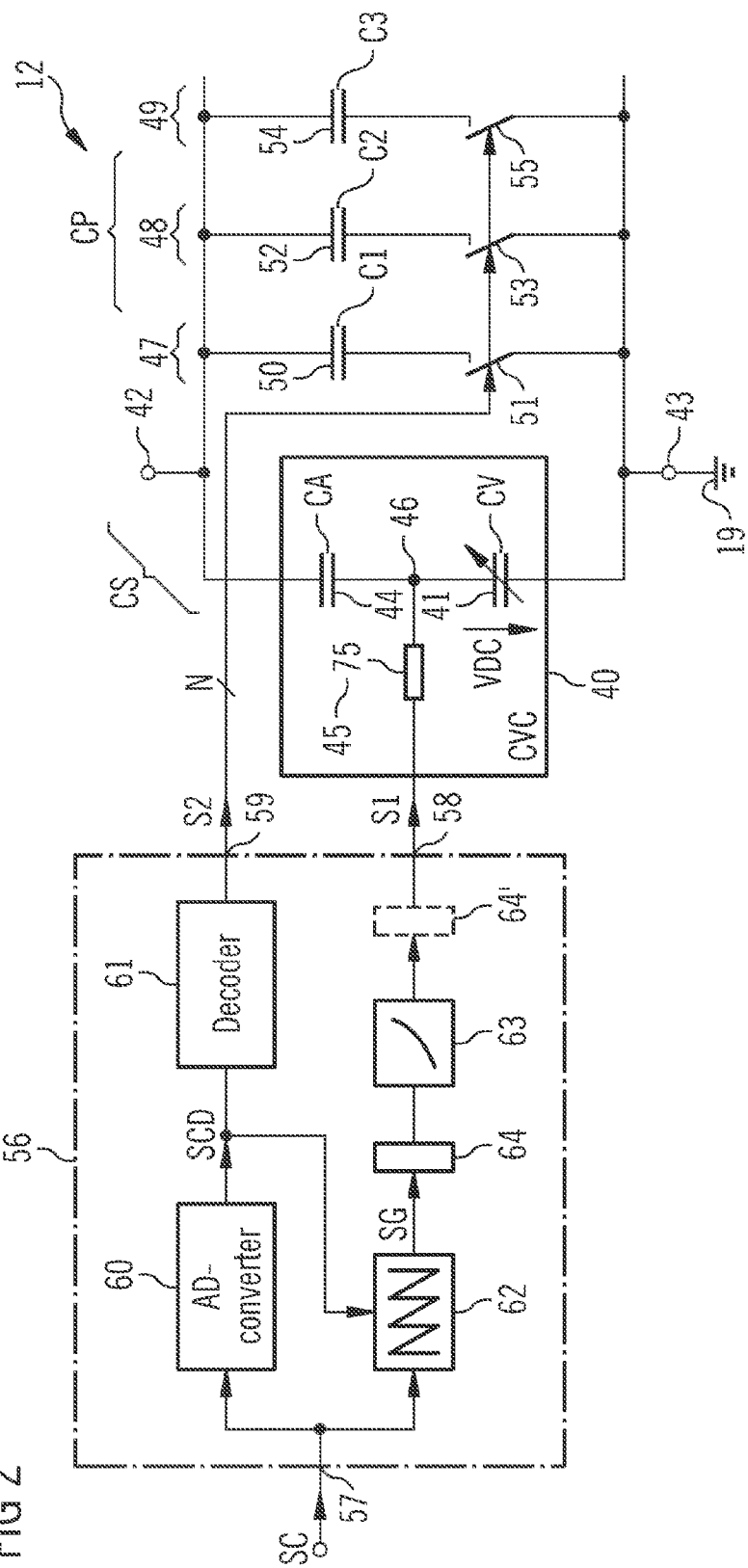

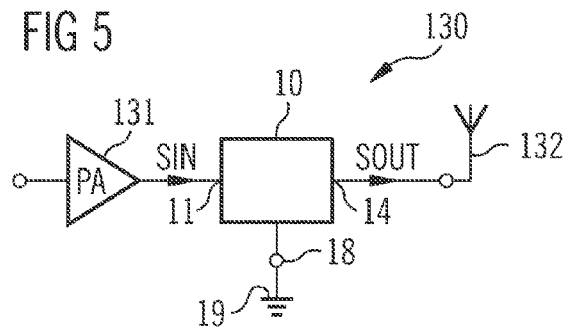
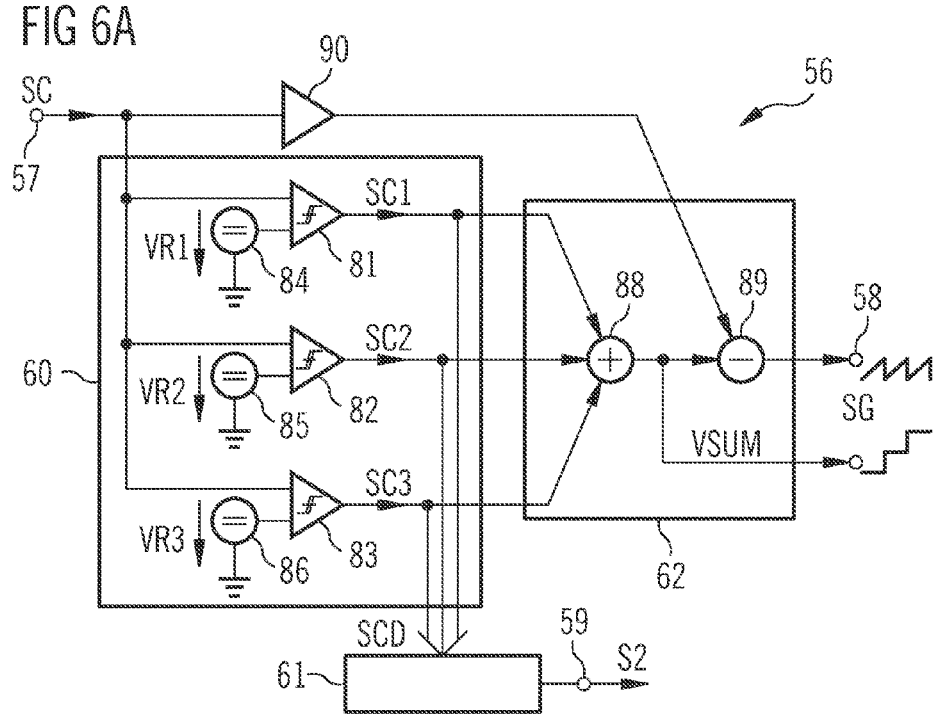
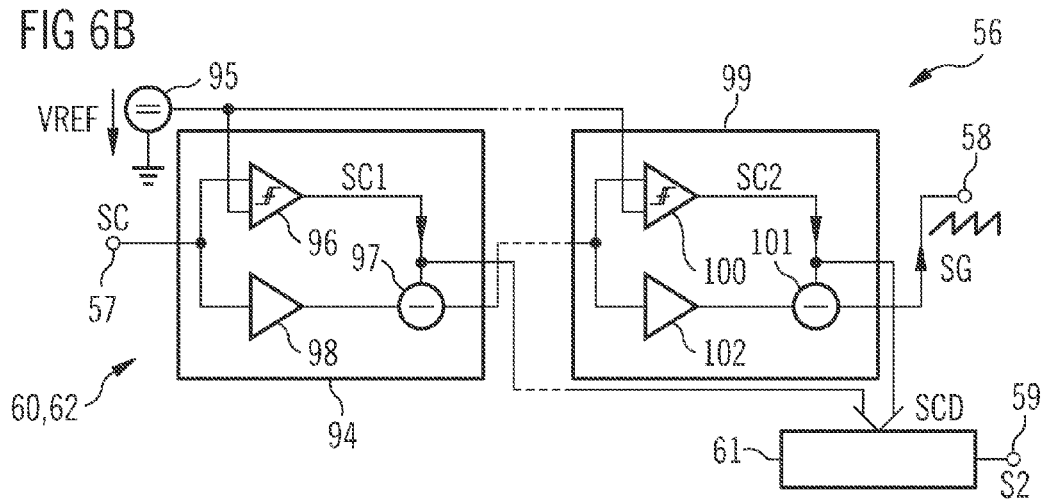

IMPEDANCE CIRCUIT AND METHOD FOR SIGNAL TRANSFORMATION

This application is a continuation of co-pending International Application No. PCT/EP2009/064855, filed Nov. 9, 2009, which designated the United States and was published in English, which application is incorporated herein by reference.

TECHNICAL FIELD

The present invention relates to an impedance circuit and a method for signal transformation.

BACKGROUND

Impedance circuits may comprise a tunable capacitor so that the characteristics of the impedance circuit can be controlled by a control signal.

U.S. Publication 2009/0134960 A1 describes several varactor circuits. U.S. Publication 2008/0122553 A1 refers to an adaptive impedance matching module comprising three tunable capacitors. U.S. Publication 2007/0247237 A1 is related to a switched capacitor array, wherein a series circuit of two varactors is coupled in parallel to the switched capacitor array.

SUMMARY OF THE INVENTION

In one aspect the present invention provides an impedance circuit and a method for signal transformation with a high flexibility for tuning the characteristic of the impedance circuit and of the signal transformation, respectively.

In one embodiment, an impedance circuit comprises an input terminal, a first and a second capacitive arrangement as well as an output terminal. The first capacitive arrangement comprises a varactor circuit having a varactor and at least one series circuit having a capacitor and a switch in series connection. The at least one series circuit is coupled in parallel to the varactor circuit. The second capacitive arrangement comprises an additional capacitor. Moreover, the input terminal is coupled to the output terminal by a network. The first and the second capacitive arrangement are parts of the network.

It is an advantage of the impedance circuit that at least two alternatives for tuning the impedance characteristics are provided. The varactor circuit allows a continuous tuning of the capacitance value of the first capacitive arrangement. The series circuit of the capacitor and the switch provides a digital method for changing the capacitance value.

In a preferred embodiment, the varactor circuit and the at least one series circuit are separated concerning their control sides. A control terminal of the switch of the at least one series circuit is not directly connected to a control terminal of the varactor circuit.

In an embodiment, the impedance circuit additionally comprises a passive component. The network comprises the first and the second capacitive arrangement as well as the passive component. The passive component may have an element such as an inductor, a resistor or a capacitor.

In an embodiment, the network is realized as a parallel circuit, a star network or a delta network. Thus, the impedance circuit can be implemented as a high pass, low pass or band pass filter.

In a further development, the second capacitive arrangement comprises an additional varactor circuit having an additional varactor and at least one additional series circuit. The at least one additional series circuit comprises the additional capacitor and an additional switch in series connection. The at least one additional series circuit is coupled in parallel to the additional varactor circuit. Thus, the capacitance value of the second capacitive arrangement can advantageously be controlled. It is an advantage of an impedance circuit comprising first and second capacitive arrangements that can both be tuned so that a flexible matching can be achieved.

A semiconductor body can comprise the impedance circuit. The impedance circuit can be realized on a first surface of exactly one semiconductor body. The impedance circuit can be fabricated in a semiconductor technology such as gallium arsenide hetero junction bipolar transistor technology, abbreviated GaAsHBT, gallium arsenide pseudo-morphic high-electron mobility transistor technology, abbreviated GaAspHEMT, gallium arsenide bipolar field-effect transistor technology, abbreviated GaAsBiFET, silicon bipolar transistor technology, silicon complementary metal oxide semiconductor field-effect transistor technology, abbreviated silicon CMOS FET, silicon bipolar complementary metal oxide semiconductor technology, abbreviated silicon BiCMOS, silicon-on-insulator technology, abbreviated SOI, or a combination of these technologies. The impedance circuit is designed so that the influence of process variations of a semiconductor process on the characteristic of the impedance circuit is low.

The impedance circuit may be part of a transmitter or a receiver chain.

In an embodiment, a communication circuit comprises a power amplifier, an antenna and the impedance circuit. The impedance circuit can be advantageously designed so that the antenna matches the power amplifier. It is an advantage of the impedance circuit that it can reduce insertion loss and generation of spurious signals such as harmonic signals, intermodulation signals and noise.

In an alternative embodiment, a phase shifter comprises the impedance circuit.

A system comprising the impedance circuit can quickly be adjusted or switched, since the capacitance value of the impedance circuit can be controlled by an analog signal.

In an alternative embodiment, an oscillator comprises the impedance circuit. The impedance circuit is advantageously tuned in such a way that an oscillation frequency of the oscillator is changed in accordance with the tunable characteristic of the impedance circuit. By the impedance circuit, the oscillator is tunable in a certain frequency range and the tuning slope is approximately constant and monotonic. The impedance circuit can be designed to tune an oscillator frequency in a closed loop provided by a phase-locked loop. The impedance circuit is realized so that a quality factor of the impedance circuit is high. This results in a low value of phase noise in the oscillator.

In an embodiment, a method for signal transformation comprises providing an input signal to an input terminal of an impedance circuit. The impedance circuit has a network comprising a first and a second capacitive arrangement. The first capacitive arrangement comprises a varactor circuit having a varactor and at least one series circuit. The at least one series circuit comprises a capacitor and a switch in series connection and is coupled in parallel to the varactor circuit. The second capacitive arrangement comprises an additional capacitor. A first signal is supplied to the varactor circuit and a second signal is applied to the at least one series circuit. An output signal is provided at an output terminal of the impedance circuit which is coupled to the input terminal of the impedance circuit by the network.

In an embodiment, the parallel coupling of the varactor circuit and the at least one series circuit means that an AC voltage which lies across the varactor circuit also lies across the at least on series circuit. However, the varactor circuit and the at least one series circuit are controlled separately.

In one embodiment, the impedance circuit is designed for impedance matching. A signal source is connected to the input terminal of the impedance circuit. An electric load is coupled to the output terminal of the impedance circuit. The impedance circuit can provide an impedance matching of the output impedance of the signal source to the input impedance of the electric load. The impedance circuit can be advantageously designed such that a power transfer from the impedance source to the electric load is maximized. This can be achieved even in case of arbitrary complex impedances of the signal source and the electric load in a predetermined frequency range. Reflection from the load can be minimized by the impedance circuit.

In an embodiment, the impedance circuit is designed for impedance switching. The signal source provides an input voltage to the input terminal of the impedance circuit. An output voltage is tapped off at the output terminal. The impedance circuit is implemented so that a voltage transfer from the input terminal to the output terminal is maximized.

BRIEF DESCRIPTION OF THE DRAWINGS

The invention is described in more detail by referring to the embodiments and the relating figures. Devices with the same structure or with the same effect are denoted by equal reference numerals. A description of a part of a circuit or a device having the same function in different figures will not be repeated in each of the following figures.

FIGS. 1A to 1D show exemplary impedance circuits according to the invention;

FIG. 2 shows an exemplary first capacitive arrangement according to the invention;

FIG. 5 shows a communication circuit according to the invention;

FIGS. 6A and 6B show exemplary control circuits according to the invention;

DETAILED DESCRIPTION OF ILLUSTRATIVE EMBODIMENTS

Figure 3A:
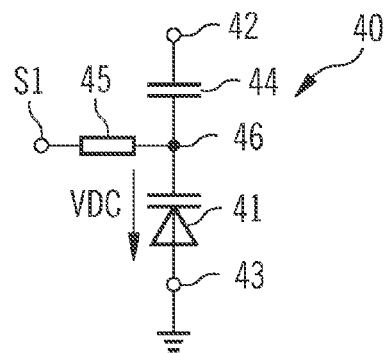
FIGS. 3A to 3D show exemplary varactor circuits according to the invention.

FIG. 1A shows an exemplary impedance circuit. The impedance circuit 10 comprises an input terminal 11, a first and a second capacitive arrangement 12, 13 and an output terminal 14. The first and the second capacitive arrangement 12, 13 couples the input terminal 11 to the output terminal 14. The impedance circuit 10 has a network in form of a parallel circuit of the first and the second capacitive arrangement 12, 13. The first capacitive arrangement 12 is tunable. The first capacitive arrangement 12 has a first terminal 42 and a second terminal 43. The first terminal 42 is connected to the input terminal 11. The second terminal 43 is connected to the output terminal 14. The second capacitive arrangement 13 comprises an additional capacitor 15. An input signal SIN is provided to the input terminal 11. An output signal SOUT is tapped off at the output terminal 14. The output signal SOUT is a function of the input signal SIN and the impedance circuit 10.

FIG. 1B shows a further exemplary embodiment of the impedance circuit. The impedance circuit 10 further comprises a passive component 16. The passive component 16 comprises an inductor 20. The passive component 16, the first and the second capacitive arrangements 12, 13 are arranged in a delta network 17. The delta network 17 has three paths and three terminals. A first path of the delta network 17 comprises the first capacitive arrangement 12 and a second path comprises the second capacitive arrangement 13. The second capacitive arrangement 13 is realized as a tunable capacitor. Moreover, a third path comprises the passive component 16. The input terminal 11 is implemented as a first terminal of the delta network 17. The output terminal 14 is realized as a second terminal of the delta network 17. The first capacitive arrangement 12 couples the input terminal 11 to a further terminal 18 that is a third terminal of the delta network 17. The second terminal 43 is connected to the further terminal 18. The second capacitive arrangement 13 couples the output terminal 14 to the further terminal 18. The passive component 16 couples the input terminal 11 to the output terminal 14. The further terminal 18 is connected to a reference potential terminal 19 or to a supply voltage terminal.

The impedance circuit 10 is designed as a low pass filter. The filter characteristic can be tuned by tuning the first and the second capacitive arrangement 12, 13. The input signal SIN and the output signal SOUT are AC signals such as AC voltages that are related to the reference potential terminal 19. The output signal SOUT is provided as a filtered signal of the input signal SIN. The impedance circuit 10 advantageously attenuates signals of undesired harmonic frequencies.

FIG. 1C shows an exemplary impedance circuit which is a further development of the impedance circuits shown in FIGS. 1A and 1B. The impedance circuit 10' is arranged in a star network 21. The star network 21 comprises three paths which couple a central node 22 to three terminals. A first path of the star network 21 comprises the first capacitive arrangement 12 and a second path comprises the second capacitive arrangement 13. Moreover, a third path comprises the passive component 16. A first terminal of the star network 21 is the input terminal 11 of the impedance circuit 10' and a second terminal is the output terminal 14. A further terminal 18 of the star network 21 is connected to the reference potential terminal 19 or a supply voltage terminal. Thus, the input terminal 11 is coupled to the central node 22 via the first capacitive arrangement 12. The second terminal 43 is connected to the central node 22. The central node 22 is coupled to the output terminal 14 via the second capacitive arrangement 13. The central node 22 is connected to the further terminal 18 via the passive component 16. The impedance circuit 10' is designed as a high pass filter.

In alternative embodiments of FIGS. 1A to 1C, the second terminal 43 is connected to the input terminal 11. In FIG. 1A, the first terminal 42 is connected to the output terminal 14. In FIG. 1B, the first terminal 42 is then connected to the further node 18. Moreover in FIG. 1C, the first terminal 42 is connected to the central node 22.

FIG. 1D shows a further exemplary impedance circuit 10". The impedance circuit 10" comprises one or more further capacitive arrangements 23, one or more further passive components 24, 25, one or more further input terminals 26, 27 and one or more further output terminals 28, 29. The impedance circuit 10 of FIG. 1A to 1D can be implemented in a tunable matching network, a tunable phase shifter or an oscillator with a tunable frequency.

FIG. 2 shows an exemplary first capacitive arrangement which can be used in the impedance circuit shown in FIGS. 1A to 1D. The second capacitive arrangement 13 of FIGS. 1A to 1D can also be implemented such as the first capacitive arrangement 12 shown in FIG. 2. The first capacitive arrangement 12 comprises a varactor circuit 40 that has a varactor 41. A blocking capacitor 44 of the varactor circuit 40 is connected in series to the varactor 41. The series circuit of the varactor 41 and the blocking capacitor 44 is arranged between the first and the second terminal 42, 43. The blocking capacitor 44 is connected to the first terminal 42. The varactor 41 is connected to the second terminal 43. The varactor circuit 40 is realized as capacitive voltage divider comprising the varactor 41 and the blocking capacitor 44. The varactor circuit 40 comprises a bias circuit 45. The bias circuit 45 has a resistor 75. An output of the bias circuit 45 is connected to a varactor node 46 between the blocking capacitor 44 and the varactor 41.

Moreover, the first capacitive arrangement 12 comprises at least one series circuit 47 to 49. The varactor circuit 40 is connected in parallel to the at least one series circuit 47 to 49. A first, a second and a third series circuit 47, 48, 49 couples the first terminal 42 to the second terminal 43. The first, the second and the third series circuit 47, 48, 49 form parallel branches. The first series circuit 47 is a first branch. The first series circuit 47 comprises a first capacitor 50 and a first switch 51 which are arranged in series. The second and the third series circuit 48, 49 is implemented such as the first series circuit 47. The second series circuit 48 comprises a second capacitor 52 and a second switch 53. Correspondingly, the third series circuit 49 comprises a third capacitor 54 and a third switch 55. The second and the third series circuit 48, 49 form a second and a third branch. The first, the second and the third capacitors 50, 52, 54 have the first, the second and the third capacitance value C1, C2, C3, respectively. The first capacitive arrangement 12 comprises a parallel circuit of a number N of series circuits 47 to 49. The number N can be any number larger or equal than 1. The capacitance value CN of a capacitor of the N-th series circuit can be calculated according to the following equation:

$$CN = C1 \cdot 2^{N-1} \quad (1),$$

wherein the first capacitance value C1 is the smallest capacitance value of the capacitors 50, 52, 54 of the series circuits 47 to 49. Thus, binary coding is implemented in the first capacitive arrangement 12. The smallest capacitance value C1 can also be named the least significant bit capacitance value. The parallel circuit of the at least one series circuit 47 to 49 can also be described as switchable capacitor bank or switched capacitor array.

Furthermore, the first capacitive arrangement 12 comprises a control circuit 56. The control circuit 56 has an input 57 and a first output 58 which is connected to the varactor circuit 40. The first output 58 is coupled to the varactor node 46 via the bias circuit 45. A second output 59 of the control circuit 56 is coupled to the control terminals of the first, the second and the third switch 51, 53, 55. The second output 59 is implemented as a parallel bus terminal. The control circuit 56 comprises an analog-to-digital converter 60, abbreviated AD-converter, that couples the input 57 to the second output 59. Thus, the AD-converter 60 is arranged between the input 57 and the control terminals of the switches 51, 53, 55 of the at least one series circuit 47 to 49. The AD-converter 60 can be a full flash converter. A decoder 61 of the control circuit 56 connects an output of the AD-converter 60 to the second output 59. Moreover, the control circuit 56 comprises a generator 62. The input 57 is coupled via the generator 62 to the first output 58.

The generator 62 is also connected on its input side to the output of the AD-converter 60. A shaper circuit 63 of the control circuit 56 couples an output of the generator 62 to the first output 58. Further on, the control circuit 56 comprises an error correction circuit 64 which is coupled to the output of the generator 62. Thus, the error correction circuit 64 couples the generator 62 to the shaper circuit 63.

A control signal SC is provided to the input 57 of the control circuit 56 for controlling the first capacitive arrangement 12. The control signal SC is implemented as an analog signal. It is realized as a voltage and has a predetermined voltage range. A first and a second signal S1, S2 is generated depending on the control signal SC by the control circuit 56. The control signal SC is a linear function of a predetermined capacitance value CS of the first capacitive arrangement 12. The control signal SC is applied to the AD-converter 60 that generates a digital control signal SCD. The digital control signal SCD is supplied to the switches 51, 53, 55 via the decoder 61. In case the capacitance value C1, C2, C3 of the first, the second and the third capacitor 50, 52, 54 are designed in accordance to equation 1, the decoder 61 comprises only lines which connect the output of the AD-converter 60 to the control terminals of the switches 51, 53, 55. The output of the AD-converter 60 is realized as a terminal of a parallel bus.

The generator 62 provides a generator signal SG which depends on the control signal SC and the desired capacitance value CP which is provided by the at least one series circuit 47 to 49. The generator 62 can be implemented as a saw tooth generator. The generator signal SG is an analog signal. The generator signal SG depends on the difference between the predetermined capacitance value CS of the first capacitive arrangement 12 and the present capacitance value CP of the at least one series circuit 47 to 49. Thus, the generator signal SG contains the information about the capacitance value CVC which has to be provided by the varactor circuit 40. The capacitance value CS of the first capacitive arrangement 12 is the sum of the capacitance value CVC of the varactor circuit 40 and of the capacitance value CP of the at least one series circuit 47 to 49, that means CS=CVC+CP. Thus, the generator signal SG is a linear function of a predetermined value of the capacitance value CVC of the varactor circuit 40. The first and the second signal S1, S2 are provided so that the sum of the capacitance value CVC of the varactor circuit 40 and of the capacitance value CP of the at least one series circuit 47 to 49 equals the predetermined capacitance value CS of the first capacitive arrangement 12.

Since the capacitance value CVC of the varactor circuit 40 depends in a non-linear manner on the first signal S1, the shaper circuit 63 provides the first signal S1 so that the first signal S1 is a non-linear function of the generator signal SG. The error correction circuit 64 is designed for calibrating the capacitance value CVC of the varactor circuit 40. The error correction circuit 64 is realized so that the range of the capacitance value CVC of the varactor circuit 40 is equal to the capacitance value C1 of the first capacitor 50. The error correction circuit 64 reacts in real time. The error correction circuit 64 can comprises a software table. The software table is controlled in a calibration procedure by a system comprising the impedance circuit 10.

The first signal S1 is applied to the varactor circuit 40 via the first output 58. The first signal S1 controls the capacitance value CVC of the varactor circuit 40. The first signal S1 is an analog signal. The first signal S1 is realized as a voltage. By the first signal S1, a varactor voltage VDC across the varactor 41 is set and, therefore, the capacitance value CV of the varactor 41 is controlled. The bias circuit 45 inhibits a high-frequency voltage at the varactor node 46 from being applied to the first output 58. The blocking capacitor 44 having the capacitance value CA inhibits a DC current flowing through the varactor circuit 40.

The second signal S2 is supplied to the control terminals of the first, the second and the third switch 51, 53, 55 via the second output 59. The second signal S2 is implemented as a digital parallel bus signal. The second signal S2 provides a digital control of the capacitance value CP of the parallel circuit of the at least one series circuit 47 to 49. In a first state of operation, the second signal S2 sets the first switch 51 in a conducting state. Therefore, the first series circuit 47 obtains the first capacitance value C1. In a second state of operation, the first switch 51 is set in a non-conducting state. Thus, the capacitance value of the first series circuit 47 is approximately zero. The second signal S2 controls which of the capacitors 50, 52, 54 of the at least one series circuit 47 to 49 contributes to the capacitance value CS of the first capacitive arrangement 12.

The varactor 41 and the capacitors 44, 50, 52, 54 of the first capacitive arrangement 12 can be fabricated by a semiconductor technology or a micro-electro-mechanical system technology. The switches 51, 53, 55 are realized as field-effect transistors. The impedance circuit 10 can be realized as a single chip or as a multi chip. In case of a multi chip, the switchable capacitors 50, 52, 54 and the varactor 41 are integrated by a hybrid technology. The impedance circuit 10 is advantageously controlled by an analog circuitry. Therefore, there is no need for elaborate digital control.

The first capacitive arrangement 12 is advantageously controlled so that the first capacitive arrangement 12 has a capacitance value CS out of a predetermined capacitance range between a minimum capacitance value CMIN and a maximum capacitance value CMAX. Advantageously, a monotonic control of the capacitance value CS of the first capacitive arrangement 12 can be achieved. The derivative dC/dV, that is d CS/d SC, is either positive or negative over the full range of the control signal SC. The first capacitive arrangement 12 shows a high quality factor. The quality factor is the ratio of the imaginary part of the impedance and the resistive part of the impedance of the first capacitive arrangement 12. A high quality factor results in a low insertion loss of a matching network. Further on, the first capacitive arrangement 12 shows a low distortion. The increase of the number N reduces the distortion. The number N can be selected such that a good tradeoff between the complexity of the impedance circuit 10 and the distortion caused by the impedance circuit 10 can be found.

In an alternative embodiment, the capacitance values C1, C2, C3 of the first, the second and the third capacitor 50, 52, 54 are not realized according to equation 1. Thus, the decoder 61 comprises logic gates. The decoder 61 can be implemented to provide a gray-coding or a thermometer-coding. In case of gray-coding or thermometer-coding, only one switch of the first, the second and the third switch 51, 53, 55 is actuated at one point of time. A mixture of binary coding, gray-coding or thermometer-coding can also be used.

In an alternative embodiment, the error correction circuit 64 is coupled to an output of the shaper circuit 63. The position is indicated by broken lines.

In an alternative embodiment, the bias circuit 45 comprises at least one element of a group having a diode, a transistor, a resistor 75 and an inductor such as a choke inductor.

FIGS. 3A to 3D show exemplary varactor circuits which are further embodiments of the varactor circuit shown in FIG. 2 and which can be used in the first and the second capacitive arrangement of FIG. 2. According to FIG. 3A, the varactor 41 is oriented in such a way that a DC voltage at the varactor node 43 does not result in a DC current through the varactor 41. The cathode of the varactor 41 is connected to the varactor node 46. If the varactor voltage VDC is positive, a DC current can neither flow from the varactor node 46 through the blocking capacitor 44 nor through the varactor 41. Thus, the varactor 41 can be controlled in an energy-saving manner.

Figure 3B:
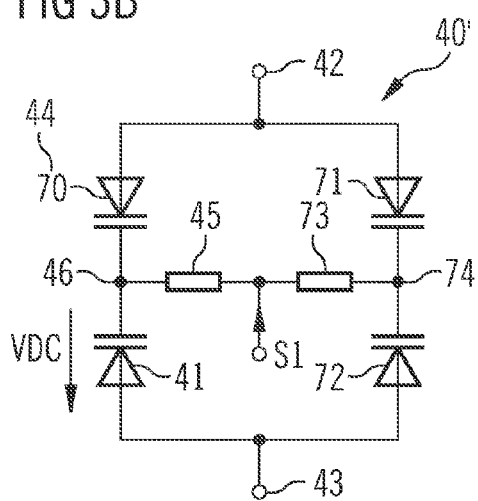

In the varactor circuit 40' of FIG. 3B, the blocking capacitor 44 is implemented as a second varactor 70. The second varactor 70 and the varactor 41 are oriented in such a way that no DC current can flow through the series circuit of the varactor 41 and the second varactor 70. Furthermore, the varactor 41 and the second varactor 70 are oriented so that a DC potential at the varactor node 46 does neither result in a DC current through the varactor 41 nor through the second varactor 70. By the series circuit of the varactor 41 and the second varactor 70, the characteristic of the varactor circuit 40' is more linear in comparison to the characteristic of the varactor circuit 40 of FIG. 3A. Moreover, the varactor circuit 40' comprises a third and a fourth varactor 71, 72 which are connected in series. The series circuit of the third and the fourth varactor 71, 72 is coupled in parallel to the series circuit of the varactor 41 and the second varactor 70. This parallel coupling of the two series circuits increases the capacitance value CVC of the varactor circuit 40'. The first output 58 is connected via a further bias circuit 73 to a further varactor node 74.

Figure 3C:
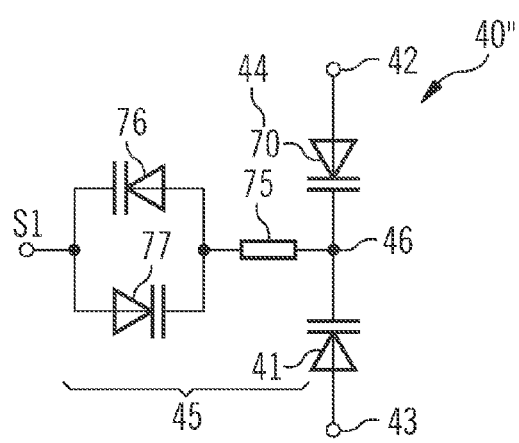

According to FIG. 3C, the bias circuit 45 comprises a parallel circuit of a first and a second bias varactor 76, 77. The parallel circuit of the bias varactors 76, 77 is connected in series to the resistor 75. An anode of the first bias varactor 76 is connected to a cathode of the second bias varactor 77. An anode of the second bias varactor 77 is connected to a cathode of the first bias varactor 76. By the anti-parallel varactor pair 76, 77, a high impedance of the bias circuit 45 is achieved. Thus, the energy consumption for generating the varactor voltage VDC is low.

Figure 3D:
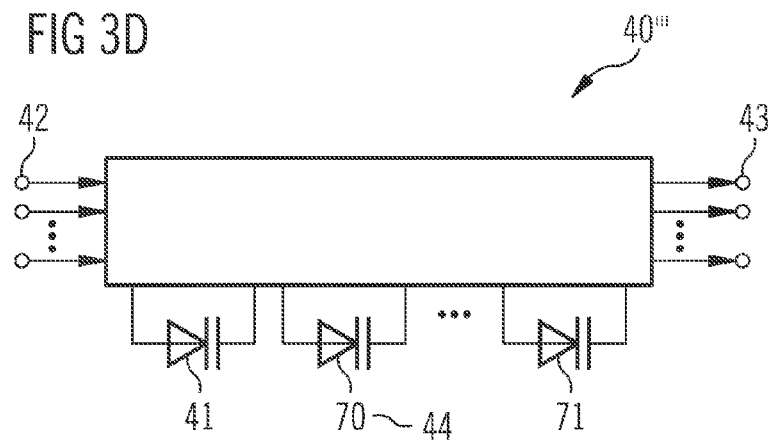

The varactor circuit 40''' of FIG. 3D comprises at least three varactors 41, 70, 71. The varactor circuit of FIGS. 3B to 3D comprises more than one varactor. Thus, the distortion caused by the varactor circuit 40 is reduced by cancellation effects.

Figure 4A:
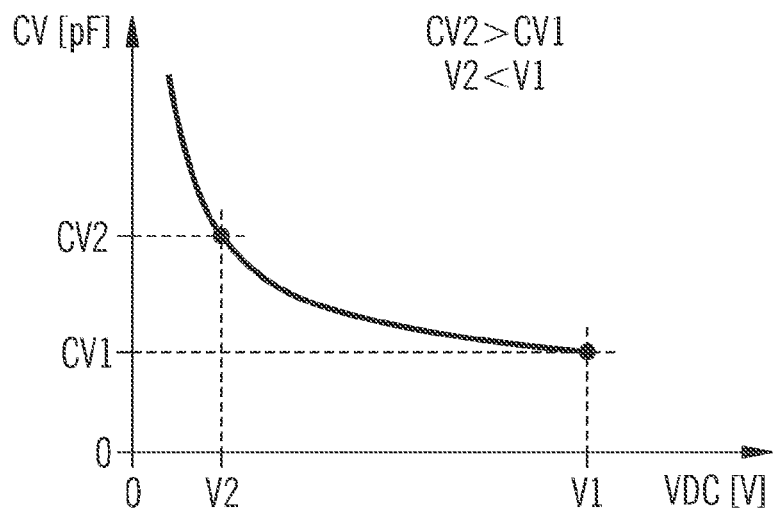
FIGS. 4A and 4B show exemplary capacitance characteristics.

FIG. 4A shows an exemplary characteristic of the varactor 41. The capacitance value CV of the varactor 41 is shown dependent on the varactor voltage VDC which is a DC voltage between the anode and the cathode of the varactor 41. The capacitance value CV is reduced by an increase of the varactor voltage VDC. The varactor 41 has the first capacitance value CV1 at a first varactor voltage V1 and the second capacitance value CV2 at a second varactor voltage V2. The second voltage V2 can be a minimum voltage which is applied to the varactor 41. The first voltage V1 can be a maximum voltage which is provided to the varactor 41. The capacitance value CV depends on the varactor voltage VDC according to the equation:

$$CV = \frac{K}{(phi + VC)^m} + C0, \quad (2)$$

wherein K, phi, m and C0 are fitting parameters. Since the blocking capacitor 44 is connected in series to the varactor 41, the varactor voltage VDC is removed from the impedance circuit 10. The first capacitance value CVC1 of the varactor circuit 40 depends on the first capacitance value CV1 of the varactor 41 and the capacitance value CA of the blocking capacitor 44. Similarly, the second capacitance value CVC2 of the varactor circuit 40 depends on the second capacitance value CV2 and the capacitance value CA. The values CVC1 and CVC2 can be calculated according to the equations:

$$CVC1 = \frac{CA \cdot CV1}{CA + CV1} \text{ and } CVC2 = \frac{CA \cdot CV2}{CA + CV2} \quad (3, 4)$$

The varactor 41 and thus the varactor circuit 40 can obtain a continuous spectrum of capacitance values. The series circuit of the varactor 41 and the blocking capacitor 44 reduces the non-linearity of the varactor circuit 40. The non-linear relationship between the capacitance value CV and the varactor voltage VDC may result in a harmonic distortion. The capacitor divider comprising the varactor 41 and the blocking capacitor 44 ensures that only a small fraction of the total high-frequency voltage swing between the first and the second terminal 42, 43 is available across the varactor 41. The distortion may be a result of the high-frequency alternating voltage across the varactor 41 and it may be not a function of the alternating current through the varactor 41. The effect of the distortion caused by the varactor 41 is reduced, since the varactor 41 is only weakly coupled to the impedance circuit 10 by means of the blocking capacitor 44 and a less voltage swing is present across the varactor 41.

Figure 4B:
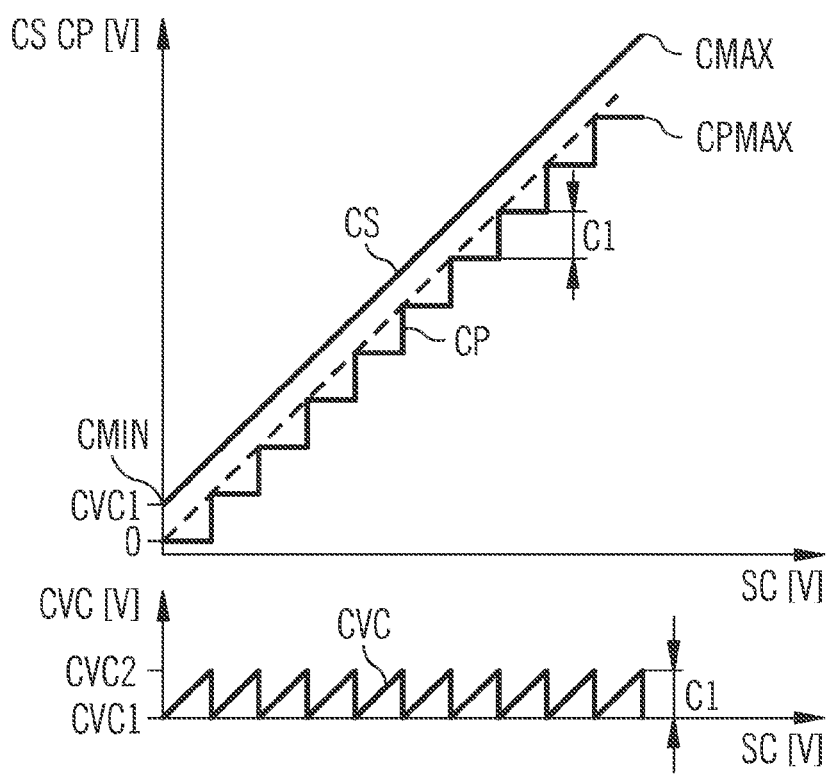

FIG. 4B shows an exemplary characteristic of capacitance values of the first capacitive arrangement. The capacitance value CVC of the varactor circuit 40, the capacitance value CP of the parallel circuit of the at least one series circuit 47 to 49 and the capacitance value CS of the first capacitive arrangement 12 depend on the control signal SC. The capacitance value CP is increased step-wise depending on the control signal SC. The capacitance value CP has the form of a staircase. The height of one step is equal to the first capacitance value C1. The number of steps depends on the number N of the at least one series circuit 47 to 49. The maximum value CPMAX of the capacitance value CP is achieved if all switches 51, 53, 55 are in the conducting state. Thus, the minimum capacitance value CMIN of the first capacitive arrangement 12 is the capacitance value CVC1 of the varactor circuit 40, whereas the maximum capacitance value CMAX is the sum of the value CPMAX and the capacitance value CVC2. The capacitance value CS linearly depends on the control signal SC. There are approximately no steps in the characteristic of the capacitance value CS.

The influence of the harmonic and intermodulation distortion caused by the varactor 41 is reduced by the blocking capacitor 44 and the parallel circuit of the at least one series circuit 47 to 49. Furthermore, the first capacitive arrangement 12 obtains a high quality factor. The coarse tuning of the capacitance value of the impedance circuit 10 is performed by means of the switchable capacitors 50, 52, 54 and the fine-tuning is done by the weakly coupled varactor 41. The total variation of the capacitance value CS is the sum of the variation of the capacitance value CVC of the linear block and of the variation of the capacitance value CP of the switchable block.

The capacitance value range which can be tuned be means of the varactor circuit 40 is equal or higher than each of the steps of the capacitance value CP of the parallel circuit of the at least one series circuit 47 to 49. The steps are equal to the first capacitance value C1. The voltage range of the saw-tooth of the first signal S1 is chosen to change the capacitance value CVC of the varactor circuit 40 precisely with the same minimum capacitance value such as the parallel circuit of the at least one series circuit 47 to 49 is able to change.

FIG. 5 shows an exemplary communication circuit in which the impedance circuit of FIGS. 1A to 1D can be used. The communication circuit 130 comprises a power amplifier 131, the impedance circuit 10 and an antenna 132. The impedance circuit 10 couples an output of the power amplifier 131 to the antenna 132. The impedance circuit 10 is implemented as a matching network between the power amplifier 131 and the antenna 132. The impedance circuit 10 is used in a high-frequency circuit, for example, for mobile communication. Requirements of a device for mobile communication concerning the radiated emissions can be fulfilled by the impedance circuit 10. The impedance circuit 10 achieves a low-loss impedance transformation between the power amplifier 131 and the antenna 132 under various operating conditions. The impedance circuit 10 compensates a mismatch of the power amplifier 131 to the antenna 132 and enhances the radiation efficiency of devices for mobile communication.

FIG. 6A shows an exemplary embodiment of details of the control circuit 56. The AD-converter 60 comprises at least one comparator 81. The AD-converter 60 of FIG. 6A is designed as a parallel converter. The AD-converter 60 comprises a first, a second and a third comparator 81, 82, 83. An input connection of each of the first, the second and the third comparator 81, 82, 83 is connected to the input 57 of the control circuit 56. A first reference source 84 is connected to a second input terminal of the first comparator 81. Correspondingly, a second reference source 85 is connected to a second input of the second comparator 82. A third reference source 86 is connected to a second input of the third comparator 83. The first, the second and the third reference voltages sources 84, 85, 86 can be implemented by a voltage divider with at least three nodes. The outputs of the comparators 81 to 83 form the output of the AD-converter 60. The decoder 61 is connected to the output of the AD-converter 60. In case the capacitance values C1, C2, C3 of the first, the second and the third capacitor 50, 52, 54 follow equation 1, the decoder 61 comprises digital circuits.

The generator 62 comprises a summation unit 88 and a subtraction unit 89. The summation unit 88 is coupled on its input side to the output terminals of the first, the second and the third comparator 81 to 83. A first input of the subtraction unit 89 is coupled to the input 57. A second input of the subtraction unit 89 is connected to an output of the summation unit 88. An output of the subtraction unit 89 forms the output of the generator 62 and is coupled to the first output 58. A buffer 90 couples the input 57 to the first input terminal of the subtraction unit 89.

The first reference source 84 provides a first reference voltage VR1 to the second input of the first comparator 81. Similarly, the second reference source 85 provides a second reference voltage VR2 to the second comparator 82 and the third reference source 86 generates a third reference voltage VR3 for the third comparator 83. The first, the second and the third reference voltage VR1, VR2, VR3 may be tapped at the nodes of the voltage divider. The first reference voltage VR1 is smaller than the second reference voltage VR2, the second reference voltage VR2 is smaller than the third reference voltage VR3. A difference between two subsequent reference voltages is equal to the first reference voltage VR1. The difference corresponds to the first capacitance value C1 of the first capacitor 50. The three comparators 81 to 83 compare the control signal SC with their corresponding reference voltage VR1, VR2, VR3 and generate a first, a second and a third comparator signal SC1, SC2, SC3. The digital control signal SCD comprises the first, the second and the third comparator signal SC1, SC2, SC3.

The summation unit 88 receives the first, second and third comparator signal SC1, SC2, SC3. The first, second and third comparator signal SC1, SC2, SC3 indicate that the control signal SC is larger than the corresponding reference voltage VR1, VR2, VR3. The summation circuit 88 adds the first, second and third comparator signals SC1, SC2, SC3. The summation circuit 88 adds the logical values of the comparator output signals SC1, SC2, SC3. A comparator output signal with the logical value one has the voltage value of the first reference voltage VR1. A summation voltage VSUM at the output of the summation unit 88 is equal to the number of comparators with a logical value one at their output multiplied with the first reference voltage VR1. The summation voltage VSUM is equal to the highest reference voltage VR1, VR2, VR3 which is smaller than the present control signal SC. The subtraction unit 89 generates the generator signal SG which is the difference between the control signal SC and the summation signal VSUM. As indicated in FIG. 6A, the summation signal VSUM is a step-wise function of the control signal SC and an increase of the control signal SC results in a saw-like generator signal SG.

In an alternative embodiment, the capacitance values C1, C2, C3 of the first, the second and the third capacitor 50, 52, 54 are equal. In that case, the decoder 61 only comprises connection lines which connect the output terminals of the first, the second and the third comparator 81, 82, 83 to the control terminals of the first, the second and the third switch 51, 53, 55. The output of the first comparator 81 is connected to the control terminal of the first switch 51 which is shown in FIG. 2. If for example the value of the control signal SC is larger than the first reference voltage VR1, then the first comparator signal SC1 sets the first switch 51 in a conducting state.

FIG. 6B shows an alternative embodiment of details of the control circuit 56. The control circuit 56 of FIGS. 6A and 6B can be used in the first capacitive arrangement shown in FIG. 2. The AD-converter 60 is realized as a pipe-line converter. The AD-converter 60 comprises at least one sub-circuit 94. A first sub-circuit 94 comprises a first comparator 96 and a first subtraction unit 97. A first input of the first comparator 96 and a first input of the subtraction unit 97 are coupled to the input 57. A second input of the first comparator 96 is connected to a reference voltage source 95. A second input of the first subtraction unit 97 is coupled to an output of the first comparator 96. A first buffer 98 couples the input 57 to the first input of the first subtraction unit 97.

The second sub-circuit 99 comprises a second comparator 100 and a second subtraction unit 101. Moreover, it comprises a second buffer 102. The circuit structure of the second sub-circuit 99 corresponds to the circuit structure of the first sub-circuit 94. However, a first input of the second comparator 100 and a first input of the second subtraction unit 101 are coupled to an output of the first subtraction unit 97. The output terminals of the first and the second comparator 96, 100 form the output of the AD-converter 60. The decoder 61 of FIG. 6A can also be used in the control circuit 56 of FIG. 6B. An output of the second subtraction unit 101 forms an output of the second sub-circuit 99 and is connected to the output of the generator 62. Thus, the AD-converter 60 of FIG. 6B also incorporates the generator 62.

The reference voltage source 95 generates a reference voltage VREF. The reference voltage VREF corresponds to the first capacitance value C1. The reference voltage VREF is applied to the second input of the first comparator 96 and to the second input of the second comparator 100. The control signal SC is provided to the first input of the first subtraction unit 97 and to the first input of the first comparator 96. The first comparator signal SC1 at the output of the first comparator 96 depends on a comparison of the control voltage SC and the reference voltage VREF. When the control voltage SC is higher than the reference voltage VREF, then the first comparator signal SC1 has a logical value of one and a voltage that is equal to the reference voltage VREF. At this point in time, an output voltage at the output of the first subtraction unit 97 is equal to the control signal SC minus the reference voltage VREF. However, when the control voltage SC is smaller than the reference voltage VREF, the first comparator signal SC1 has a logical value of zero and a voltage of 0 V is applied to the second input of the first subtraction unit 97. The output voltage at the first subtraction unit 97 is equal to the control signal SC at this point of time.

An output voltage of the first subtraction unit 97 is supplied via the input of the second sub-circuit 99 to the first input of the second comparator 100 and the first input of the second subtraction unit 101. An output voltage of the second subtraction unit 101 is the control signal SC minus two times the reference voltage VREF, if the output signal of the first subtraction unit 97 is larger than the reference voltage VREF that means if the present control signal SC is higher than two times the reference voltage VREF. The AD-converter 60 can comprise at least a further sub-circuit having the structure of the first and the second sub-circuit 94, 99. Each subsequent sub-circuit reduces its input signal by the reference voltage VREF, if its input signal is higher than the reference voltage VREF. By subsequent reducing the control signal SC with the reference voltage VREF, the AD-converter 60 determines the digital control signal SCD. The signal at the output terminal of the last subtraction unit of the last sub-circuit which is the second sub-circuit 99 in case of FIG. 6B is equal to the generator signal SG.

When the control signal SC rises, advantageously only one of the first, the second and the third comparator signals SC1, SC2, SC3 is changed at one point of time in the control circuits 56 of FIGS. 6A and 6B.

Figure 7:
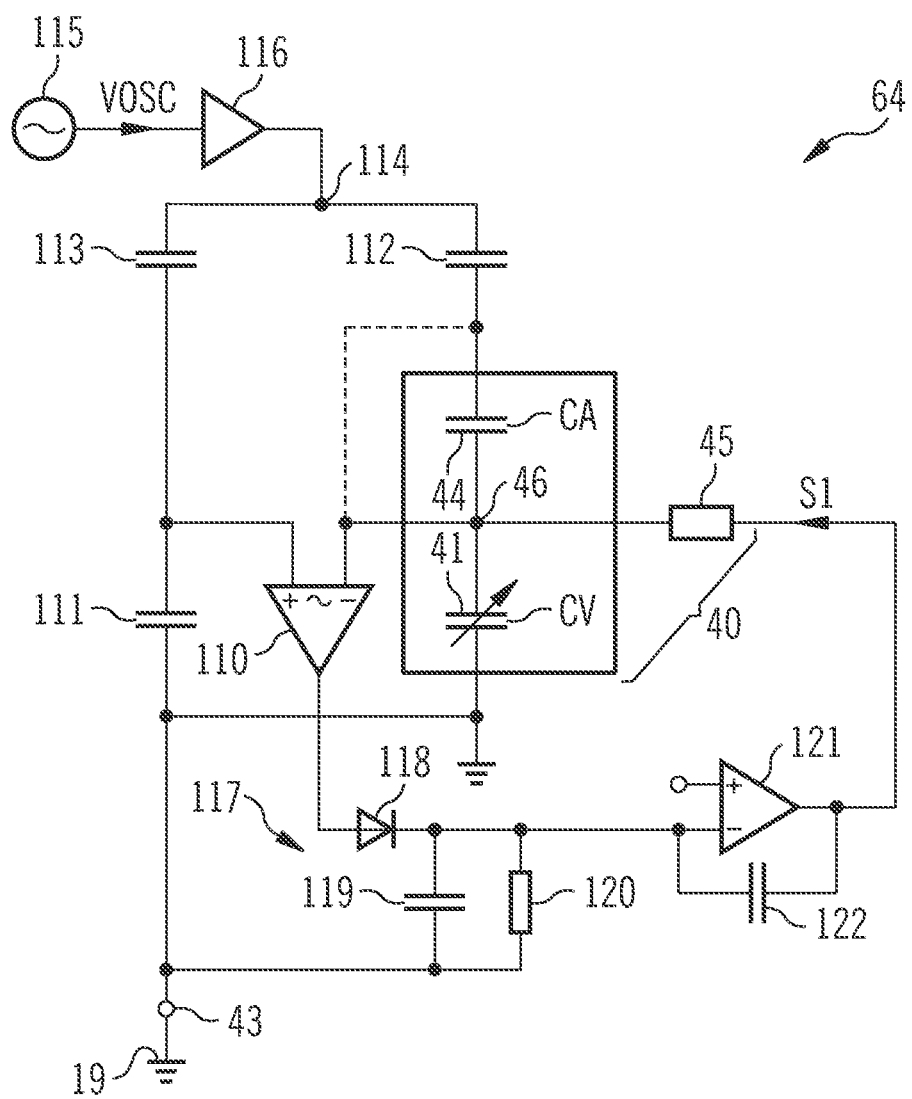
FIG. 7 shows an exemplary error correction circuit according to the invention.

FIG. 7 shows an exemplary error correction circuit which can be used in the control circuit of FIG. 2. The error correction circuit 64 is coupled to the varactor circuit 40. The error correction circuit 64 comprises an amplifier 110 and a first reference capacitor 111. The varactor node 46 is connected to a first input of the amplifier 110. The first reference capacitor 111 couples a second input of the amplifier 110 to the second terminal 43. A second reference capacitor 112 is connected in series to the varactor circuit 40. Correspondingly, a third reference capacitor 113 is connected in series to the first reference capacitor 111. The series circuit of the varactor 40 and the second reference capacitor 112 as well as the series circuit of the first and the third reference capacitor 111, 113 are connected in parallel between an input node 114 and the second terminal 43. Thus, the varactor circuit 40 and the first, the second and the third reference capacitor 111, 112, 113 are connected in a capacitive bridge configuration. The capacitance values of the first, the second and the third reference capacitor 111, 112, 113 are equal. Thus, the varactor 41 couples the first input of the amplifier 110 to the second terminal 43. The first input of the amplifier 110 is coupled via the second reference capacitor 112 and the blocking capacitor 44 to the input node 114.

Further on, an oscillator 115 has an output which is coupled to the input node 114. A buffer amplifier 116 is arranged between the oscillator 115 and the input node 114. An output of the amplifier 110 is connected to an input of a rectifier 117. The rectifier 117 comprises a rectifier diode 118, a rectifier capacitor 119 and rectifier resistor 120. The input of the rectifier 117 is coupled to an output of the rectifier 117 via the rectifier diode 118. A parallel circuit of the rectifier capacitor 119 and the rectifier resistor 120 couples the output of the rectifier 117 to the second terminal 43. A loop amplifier 121 couples the output of the rectifier 117 to the varactor circuit 40. The loop amplifier 121 is connected via the bias circuit 45 to the varactor node 46. A loop capacitor 122 is connected to the loop amplifier 121.

The oscillator 115 generates an oscillator signal VOSC which is applied to the input node 114 via the buffer amplifier 116. Thus, the oscillator signal VOSC is provided to a first path of the bridge comprising the varactor circuit 40 and the second reference capacitor 112 and also to a second path of the bridge comprising the first and the third reference capacitor 111, 113. The amplifier 110 compares a voltage across the first reference capacitor 111 with a voltage generated by the varactor circuit 40. The signal at the output of the amplifier 110 depends on the difference of the voltage across the first reference capacitor 111 and the voltage at the varactor node 46. The signal at the output of the amplifier 110 is rectified by the rectifier 117 and fed back to the varactor circuit 40. The signal at the output of the rectifier 117 is amplified by the loop amplifier 121 and applied as the first signal S1 to the bias circuit 45.

If a difference between the signals at the two input terminals of the amplifier 110 is present, the first signal S1 is changed until the difference between the inputs of the amplifier 110 becomes approximately zero. It is an advantage of the error correction circuit 64 that a value of the first signal S1 can be determined so that the maximum capacitance value of the varactor 41 is equal to the capacitance value of the first reference capacitor 111. The error correction circuit 64 can perform an auto-calibration. The error correction circuit 64 is designed such that it is invisible to a system comprising the impedance circuit 10. A dominant pole of the error correction circuit 64 is chosen to be high enough so that calibration does not influence a system comprising the impedance circuit 10.

In a calibration phase, the error correction circuit 64 performs the calibration procedure. In the calibration phase, a calibration value of the first signal S1 is determined such that the varactor circuit 40 or the varactor 41 obtains a predetermined capacitance value. The predetermined value is the capacitance of the first reference capacitor 111. The predetermined value can be equal to the first capacitance value C1 of the first capacitor 50. The predetermined value can be the capacitance value of the least significant bit. A calibration signal is determined that depends on the output signal of the error correction circuit. The calibration signal may be equal to the calibration value of the first signal S1. The calibration signal may be generated by the loop amplifier 121. The calibration signal is a constant DC voltage. The calibration signal is stored by a sample and hold circuit or in a memory.

An operation phase follows the calibration phase. In the operation phase, the first signal S1 and, therefore, the capacitance values of the varactor 41 and of the varactor circuit 40 depend on the generator signal SG and are variable and have not fixed values. The varactor 41 and the varactor circuit 40 are continuously tuned during the operation phase. However, in the operation phase the range of the first signal S1 and the range of the capacitance values of the varactor 41 and of the varactor circuit 40 are determined by the result of the calibration in the calibration phase.

The DC voltage generated in the calibration phase by the loop amplifier 121 of the error correction circuit 64 can be used to adjust the amplitude of the generator signal SG in the operation phase. Thus, in the operation phase the amplitude of the saw tooth voltage of the generator signal SG is adjusted by the signal provided by the loop amplifier 121 of the error correction circuit 64 in the calibration phase.

In a not-shown embodiment, the control circuit 10 comprises a multiplier. In the calibration phase, the error correction circuit 64 is connected to the varactor circuit 40 as shown in FIG. 7. In the operation phase, the multiplier is arranged between the generator 62 and the varactor circuit 40. A first input of the multiplier is coupled to the generator 62. A second input of the multiplier receives the calibration signal. An output of the multiplier is coupled to the varactor circuit 40. The first signal S1 can be the generator signal SG multiplied with the calibration signal. The shaper circuit 63 can be arranged between the signal generator 62 and the multiplier or between the multiplier and the varactor circuit 40.

In an alternative, not-shown embodiment, the control circuit 10 comprises a voltage controlled amplifier, abbreviated VCA. In the operation phase, the VCA is arranged between the generator 62 and the varactor circuit 40. During the operation phase, the gain of the VCA is controlled by the calibration signal. The VCA generates the first signal S1 depending on the generator signal SG and the calibration signal. The VCA is coupled on its input side to the generator 62 and on its output side to the varactor circuit 40. The shaper circuit 63 can be arranged between the signal generator 62 and the VCA or between the VCA and the varactor circuit 40.

The control circuit 10 may comprise switches which couple the varactor circuit 40 to the error correction circuit 64 in the calibration phase and to the generator 62, the multiplier or the VCA and the shaper circuit 63 as well as to the first and the second terminal 42, 43 of the first capacitive arrangement 12 in the operation phase.

In an alternative, not shown embodiment, a small fraction of a high-frequency voltage which can be tapped in a system with the impedance circuit 10 is used for calibration purpose and the oscillator 115 is omitted. If the impedance circuit 10 is part of a communication circuit, an internal voltage of the power amplifier 131 (shown in FIG. 5) can be used as the reference voltage VOSC.

In an alternative embodiment which is indicated by a broken line, the first input of the amplifier 110 is connected to a node between the varactor circuit 40 and the second reference capacitor 112. Thus, the capacitance value CVC of the varactor circuit 40 is compared to the capacitance value of the first reference capacitor 111. The capacitance value of the first reference capacitor 111 may be equal to the first capacitance value C1.

Figure 8C:
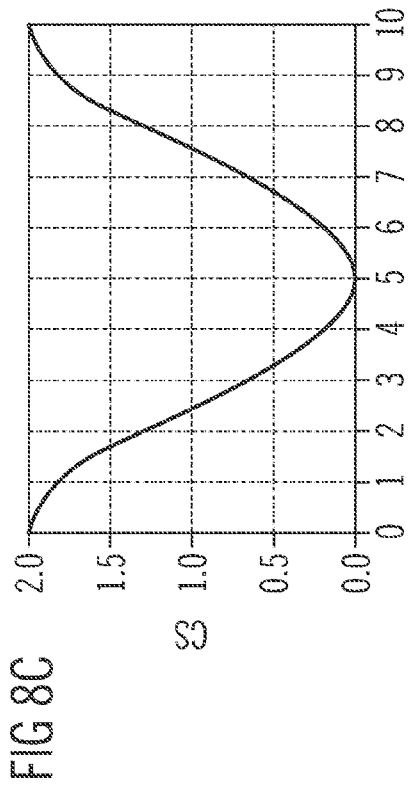
FIGS. 8A-8D and 9A-9D show exemplary signals of the first capacitive arrangement.
Figure 8D:
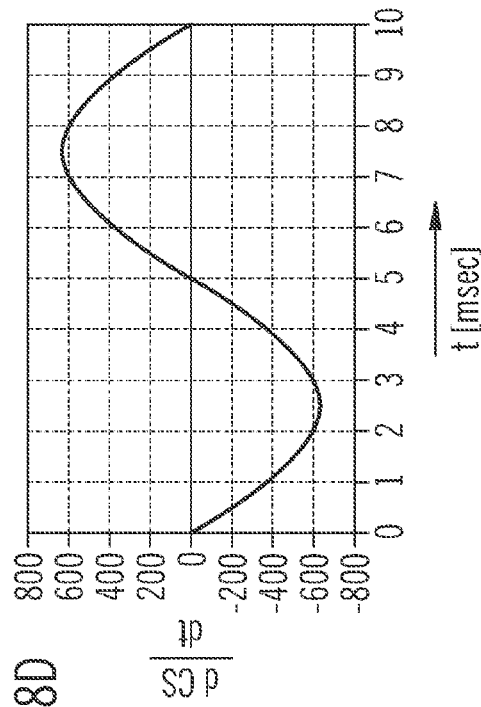
Figure 8A:
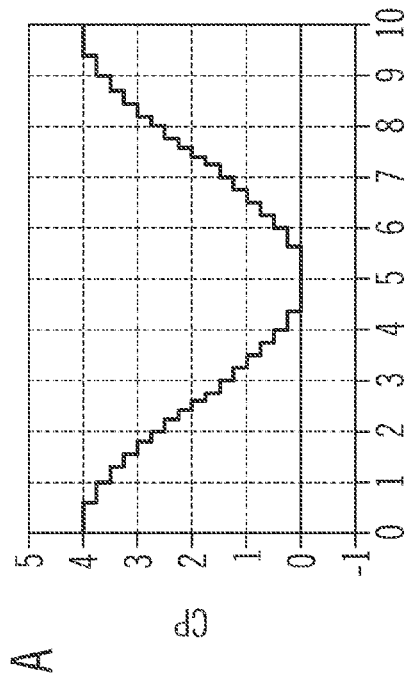
Figure 8B:
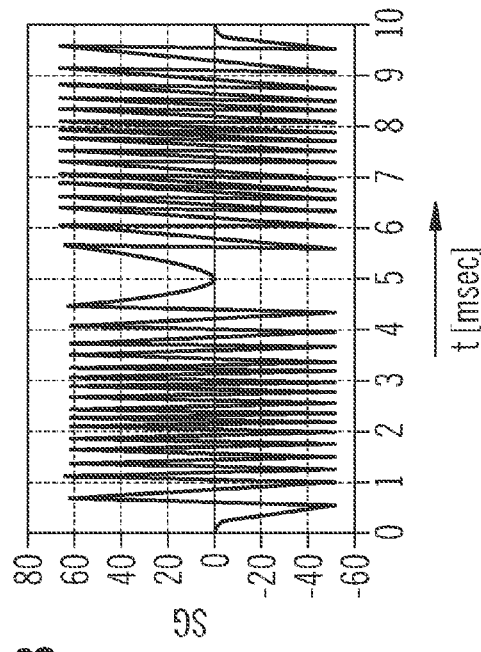
Figure 9C:
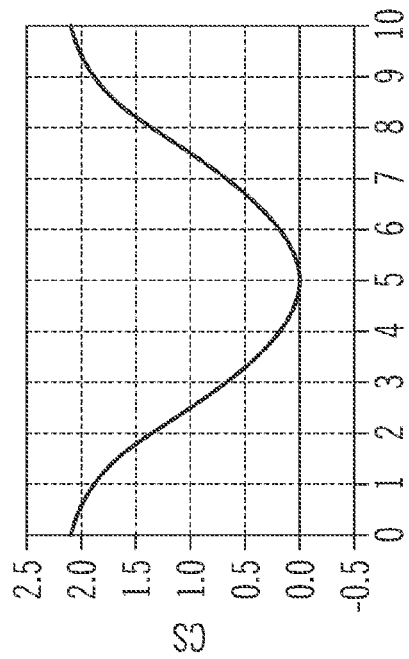
Figure 9D:
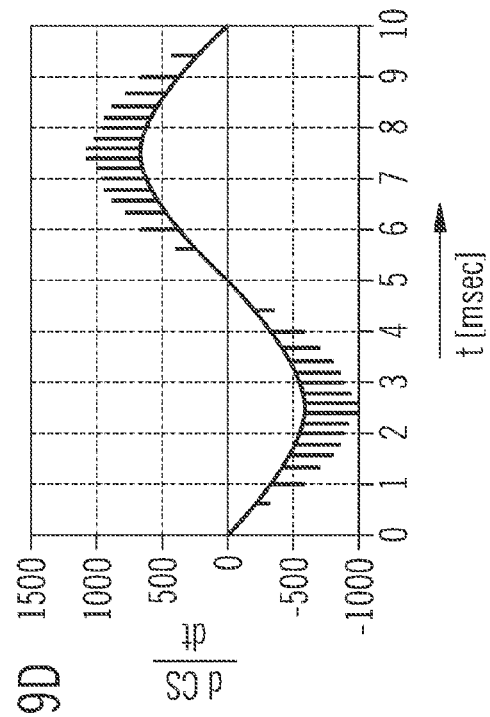
Figure 9A:
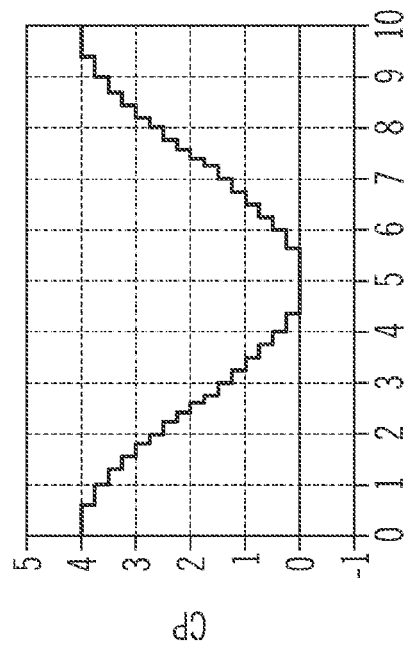
Figure 9B:
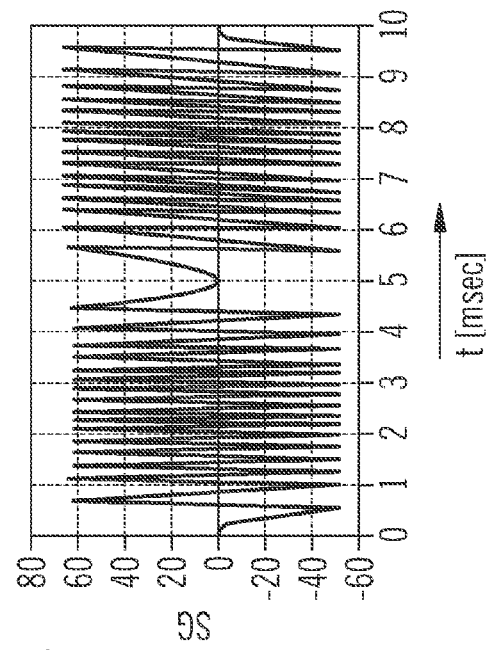

FIGS. 8A to 8D show simulation results of the first capacitive arrangement 12. The signals are shown versus a time t. The control signal SC is a sine wave with a frequency of 100 Hz. FIG. 8A shows the capacitance value CP provided by the at least one series circuit. FIG. 8B illustrates the generator signal SG which has a saw-tooth form. FIG. 8C shows the capacitance value CS of the first capacitive arrangement 12. FIG. 8D illustrates a time derivative of the capacitance value CS shown in FIG. 8C. Since the capacitance value CS shown in FIG. 8C and the derivative shown in FIG. 8D are continuous and have the sinus wave form, a very good matching of the varactor circuit 40 to the at least one series circuit 47 to 49 is demonstrated.

FIGS. 9A to 9D show exemplary simulation results which were achieved for a mismatch of 2.5% of capacitance values of different capacitors of the first capacitive arrangement 12. The mismatch results in spikes which can be seen in FIG. 9D. Since the spikes have a finite length which can be designed appropriately, a spectral pollution such as noise in a transmitter or receiving channel can be kept well within system limits. As long as the derivative of the resulting signal has the correct sign, which is also the case in FIGS. 9A to 9D, the first capacitive arrangement 12 can be used as part of a control loop.

What is claimed is:

1. An impedance circuit, comprising:
   an input terminal;
   a first capacitive arrangement that comprises a varactor circuit having a varactor and a series circuit that comprises a capacitor and a switch in series connection, the series circuit coupled in parallel with the varactor circuit;
   a second capacitive arrangement that comprises an additional capacitor; and
   an output terminal coupled to the input terminal by a network that comprises the first capacitive arrangement and the second capacitive arrangement; and
   a control circuit that controls the switch of the series circuit and controls the varactor circuit and comprising an input for receiving a control signal and an analog-to-digital converter coupled between the input of the control circuit and a control terminal of the switch of the series circuit,
   wherein the analog-to-digital converter is realized as a pipe-line converter and comprises a first sub-circuit with a first comparator and a first subtraction unit and also comprises a second sub-circuit with a second comparator and a second subtraction unit such that output terminals of the first and the second comparators form an output of the analog-to-digital converter and wherein the analog-to-digital converter incorporates a generator such that an output of the second subtraction unit is connected to an output of the generator and the generator provides a generator signal that depends on a difference between the predetermined capacitance value of the first capacitive arrangement and the present capacitance value of the series circuit.

2. An impedance circuit, comprising:
   an input terminal;
   a first capacitive arrangement that comprises a varactor circuit having a varactor and a series circuit that comprises a capacitor and a switch in series connection, the series circuit coupled in parallel with the varactor circuit;
   a second capacitive arrangement that comprises an additional capacitor;
   an output terminal coupled to the input terminal by a network that comprises the first capacitive arrangement and the second capacitive arrangement; and
   a control circuit configured to control the switch of the series circuit and to control the varactor circuit, the control circuit comprising an input configured to receive a control signal and an analog-to-digital converter coupled between the input of the control circuit and a control terminal of the switch of the series circuit,
   wherein the analog-to-digital converter is designed as a parallel converter that comprises a first, a second and a third comparator and the control circuit comprises a generator coupled between the input of the control circuit and the varactor circuit, the generator configured to provide a generator signal that depends on the control signal and a capacitance value provided by the series circuit and wherein the generator comprises a summation unit and a subtraction unit such that the summation unit is coupled on its input side to output terminals of the first, the second and the third comparators, a first input of the subtraction unit is coupled to the input of the control circuit and a second input of the subtraction unit is connected to an output of the summation unit as well as an output of the subtraction unit forms an output of the generator.

* * * * *